United States Patent [19]

Dodge et al.

[11] 4,322,847
[45] Mar. 30, 1982

[54] AUTOMATIC INDIRECT TESTING TO VERIFY OPERATIONAL CONTROL

[75] Inventors: John H. Dodge, Thornton; Larry M. Ernst, Boulder, both of Colo.

[73] Assignee: International Business Machines Corporation, Armonk, N.Y.

[21] Appl. No.: 128,685

[22] Filed: Mar. 10, 1980

[51] Int. Cl.³ .................... G01R 31/28; G06F 11/00
[52] U.S. Cl. .................................. 371/20; 340/514; 355/14 C; 371/60
[58] Field of Search .................... 371/20, 60, 57; 340/514, 515, 516; 361/23; 307/116; 355/14 R, 14 C

[56] References Cited

U.S. PATENT DOCUMENTS

| | | | |
|---|---|---|---|
| 3,539,786 | 11/1970 | Raehpour | 371/57 |
| 3,936,182 | 2/1976 | Sheikh | 355/14 R |
| 4,035,072 | 7/1977 | Deetz et al. | 355/14 R |
| 4,162,396 | 7/1979 | Howard et al. | 371/20 |
| 4,224,606 | 9/1980 | Bartles | 340/514 |
| 4,243,971 | 1/1981 | Suchowerskyj et al. | 340/516 |

FOREIGN PATENT DOCUMENTS 2025663  1/1980  United Kingdom ............... 371/20

OTHER PUBLICATIONS

Carusone et al., Automatic Diagnosticein a Processor-Controlled Copier/Printer, IBM Tech. Discl. Bulletin, vol. 21, No. 11, Apr. 1979, pp. 4397-4398.

Primary Examiner—Charles E. Atkinson
Attorney, Agent, or Firm—Carl M. Wright

[57] ABSTRACT

System and method for determining whether a first operation is responsive to a controller. A second operation, whose successful functioning depends on the successful functioning of the first operation and which produces a sensible result, is initiated while the first operation is inhibited by the controller. Sensing that the second operation is producing a result indicates that the first operation is not responsive to the controller. A further test is provided to determine whether the second operation is functioning properly.

5 Claims, 6 Drawing Figures

AUTOMATIC INDIRECT TESTING TO VERIFY OPERATIONAL CONTROL

TECHNICAL FIELD

This invention relates to electrically operated machinery under the control of an automatic controller and particularly to testing indirectly the controlled machine to verify that the controller actually has control of various functions.

A controller produces signals which initiate functions in the controlled apparatus. For safety and other purposes, it is desirable that the controller be able to verify that the function being controlled is in fact responsive to the control signals.

BACKGROUND

In the prior art, initiation of a function can be sensed by a controller when a direct feedback signal is provided to indicate that the function is operating correctly. It is, however, necessary to supply a special signal in most cases to provide the verification. There are, however, certain functions which depend on the successful operation of other functions. The second function may supply certain signals to be used by the controller for timing and similar purposes.

DISCLOSURE OF INVENTION

In accordance with the present invention, a system having at least first and second operations whose function is controlled by a controller, where the second operation depends on the successful functioning of the first operation, the second operation furnishing a signal capable of being sensed when functioning, checks that the first operation is responsive to the controller by terminating the first operation and initiating the second operation. The result of the second operation is then sensed and the first operation is determined not to be responsive to the controller if the sensed result of the second operation is manifested.

Furthermore, the invention provides for verifying that the second operation is under the control of the controller so as not to provide a false indication of the responsiveness of the first operation.

The advantage of this invention is that separate sensing lines are eliminated with the corresponding economic benefits.

DETAILED DESCRIPTION OF THE PREFERRED EMBODIMENT

Figure 1:
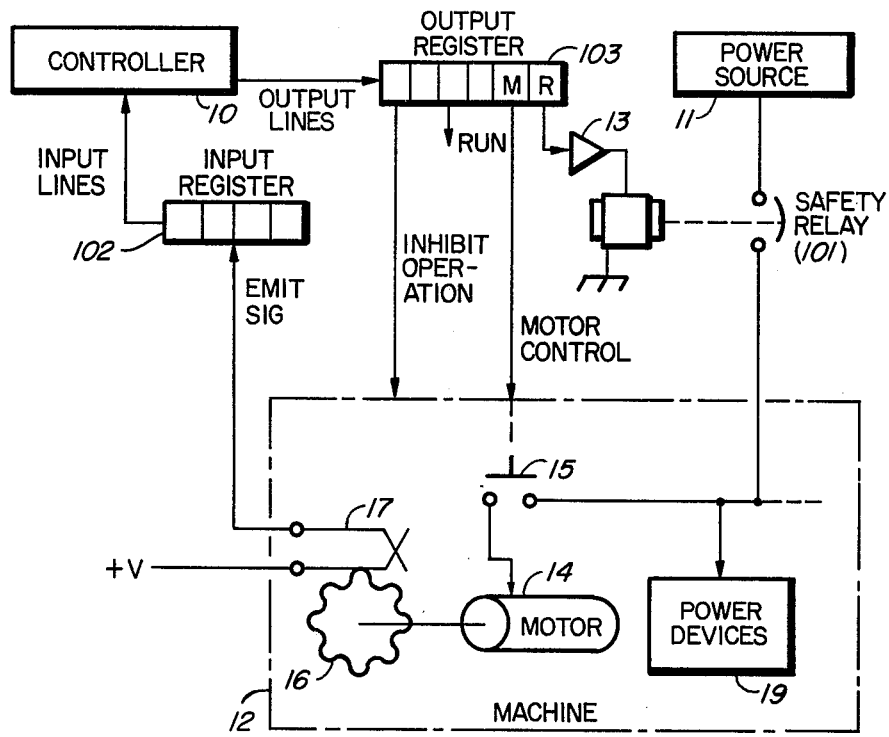
FIG. 1 is a diagram of an apparatus embodying the invention.

In FIG. 1, a machine 12 includes a motor 14 controlled by a switch 15, the motor driving a cam 16 which operates a switch 17.

A safety relay 101 connects the machine 12 to a power source 11. When the safety relay 101 is closed, power is supplied to various devices 19 within the machine which require power and to the switch 15 which controls the motor 14. The motor 14 may be, for example, the drum motor for a printer or copier and the switch 17 provides emitter signals from the machine to a controller 10 via an input register 102 for timing purposes. For control purposes, the controller 10 is provided with an output register 103.

One bit of the output register 103 (R) operates the safety relay 101 via a driver 13. Another bit (M) controls the motor switch 15, which may be a triac, relay, or the like. Other bits provide a run signal indicating that the machine can operate in the normal manner and an inhibit operation signal which causes the machine to cease operating.

The input register 102 and the output register 103 need not necessarily be separate from the controller 10 but may form a flag register and an output port, respectively, in the controller.

The machine 12, for example, might be a copier with a variety of power requiring devices, such as the fuser and lamps, in addition to the motor 14 which drives the photoconductor surface and supplies emit signals from the switch 17 in accordance with the position of the drum to provide proper control thereof.

In the invention to be described, the controller indirectly verifies that the safety relay 101, which supplies the power to the machine 12, is under the control of the controller 10 via the output register 103. Mainly, the controller will cause the safety relay to be opened, disconnecting power from the power source 11 to the machine 12. The controller 10 will then provide a signal to close the operating switch 15 to the motor 14 and sense the emit signal from the switch 17 to determine whether the safety relay in fact is opened. If the emit signals change because of the rotation of the cam 16 coupled to the motor 14, it is inferred that the motor 14 is coupled to the power source 11 and that the safety relay 101 is not responsive to the control signals from the controller 10.

In a further version of the invention, an additional feature of the invention includes the testing of the motor by closing the safety relay 101 and disconnecting the motor switch 15 to determine whether the emitter signals from the switch 17 are changing, indicating a motion of the cam 16.

Figure 2:
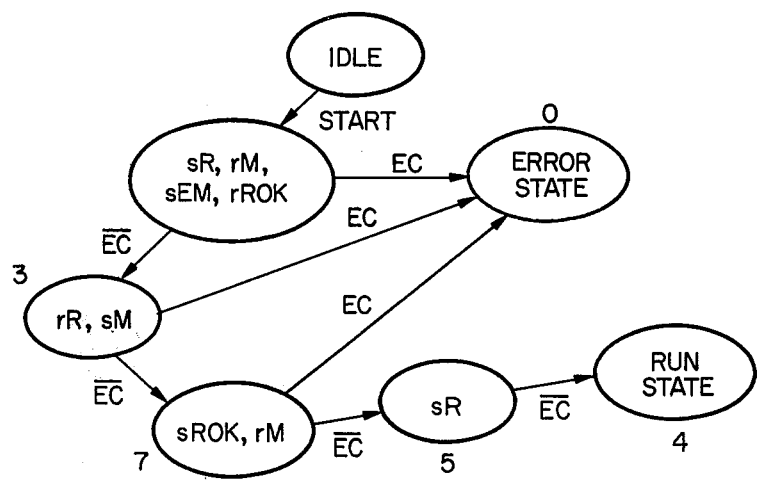
FIG. 2 is a state diagram representing the operation of the controller in the apparatus of FIG. 1.

FIG. 2 indicates a number of control states for performing the above-described tests. Starting from an idle state, the machine proceeds to state one when a start button is pushed which causes the relay bit or flip-flop to be set (sR) and the motor control bit to be reset (rM). Also set is an emitter flip-flop (sEM) to be used in determining a change in the emitter signal, and a RELAYOK flag is reset (rROK). After a suitable delay, if there is no emitter change, the machine proceeds to state three where the relay control bit is reset (rR) and the motor bit is set (sM). If an emitter change does not occur, the machine proceeds to state seven where the RELAYOK flag is set (sROK) and the motor control bit is reset (rM).

If an emitter change does not occur, the machine proceeds to state five which sets the relay control bit (sR).

In states 1, 3, 7, and 5, if an emitter change does take place, the machine proceeds to the zero state which is an error state. If the machine proceeds to state five and no emitter change occurs, the machine proceeds to state four which is the run state. In the error state zero, the operation of the machine 12 in FIG. 1 is inhibited and in the run state four, normal operation of the machine proceeds.

Figure 3:
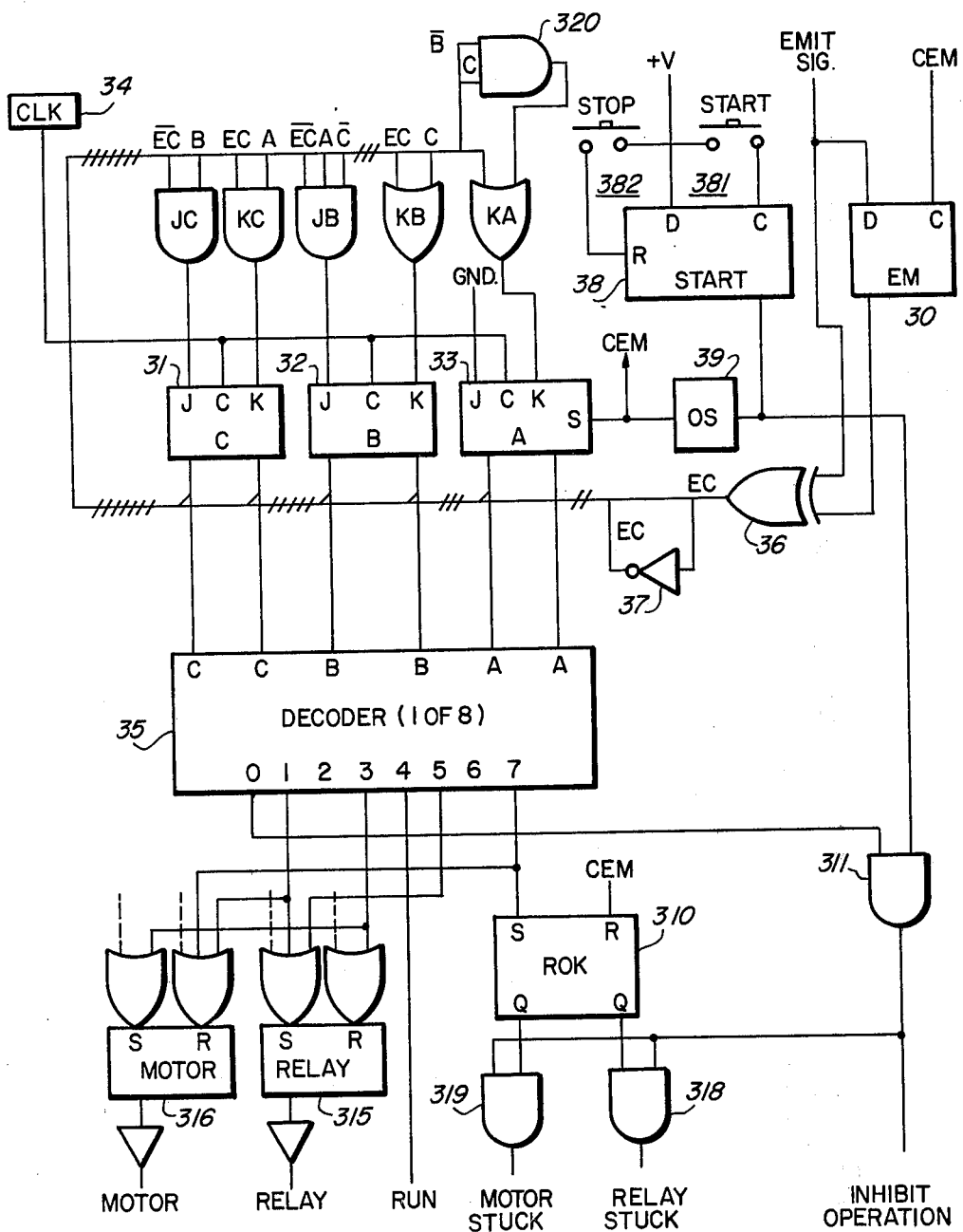
FIG. 3 is a logic diagram of a portion of the controller for stepping the controller through the state diagram of FIG. 2.

FIG. 3 is a diagram of a logic circuit suitable for cycling the controller through the states as indicated and explained in conjunction with FIG. 2. Three clocked JK flip-flops 31–33 have their outputs coupled to a decoder 35 which produces an output signal representing the state value determined by the flip-flops 31–33.

The output signals from the flip-flops 31–33 are also coupled to various AND gates and OR gates for providing the next state information to the input terminals of the flip-flops 31–33.

A clock 34 provides periodic signals for clocking the input values into the flip-flops 31–33, the period of the clock 34 being sufficiently long to permit any change of emitter signals to occur if such changes are to occur. An exclusive-OR gate 36 provides an output signal indicating an emitter change has taken place. This signal and its complement, furnished by an inverter 37, are also coupled to the input gates of the flip-flops 31–33.

A start flip-flop 38 is set by a start switch 381 and reset by a stop switch 382. The set output signal from the start flip-flop activates a one-shot multivibrator 39 which produces a short pulse which sets the flip-flop 33 and clocks the emitter signal into an EM flip-flop 30. The output signal from the one-shot 39 also resets RELAYOK (ROK) flip-flop 310.

The initial conditions of the flip-flops 31–33 are assumed to be reset which represents the error state zero. An AND gate 311 which produces an inhibit operation signal in response to the zero state signal from the decoder 35 is enabled only when the start flip-flop 38 is set. The flip-flops 31–33 may be, however, in any state in which case the output signal from the one-shot 39 should, in addition to setting the flip-flop 33, reset the flip-flops 31 and 32. In the following explanation, however, it is presumed that initially the flip-flops 31–33 are reset.

When the start button is pressed, the start flip-flop 38 is set and the flip-flops 31–33 are forced to the one state. The condition of the emitter signal is stored in the flip-flop 30. The exclusive-OR gate 36 is responsive to the set condition of the EM flip-flop 30 and to the emit signals as received so that if the emit signals change value, the exclusive-OR gate 36 will produce an output signal indicating a change in the emitter signals.

The one state output signal from the decoder 35 sets a relay flip-flop 315 and resets a motor flip-flop 316, which relays control the safety relay 101 and the motor switch 15 of FIG. 1, respectively.

If no emitter change takes place, the AND gate JB is activated by the reset condition of the flip-flop 31, the set condition of the flip-flop 33, and the output signal from the inverter 37 (indicating no emitter change) to produce a signal that causes the flip-flop 32 to be set by the next clock pulse. The flip-flops 31 and 33 have no inputs which cause a change so the machine is forced into state three. The output signal from state three from the decoder 35 resets the relay flip-flop 315 and sets the motor flip-flop 316.

Failure of the emitter signal to change causes the AND gate JC to be activated by the set output signals from the flip-flop 32 and the signal from the inverter 37. Since no signal occurs that causes the other flip-flops to change, the machine is forced into state seven. The output signal for state seven from the decoder 35 sets the ROK flip-flop 310 and resets the motor flip-flop 316.

The absence of an emitter change causes the OR gate KB to be activated, resetting the flip-flop 32 at the next clock pulse. The other flip-flops do not change states so the machine is forced into state five. The output signal from the decoder 35 for state five sets the relay flip-flop 315.

The next clock pulse, in the absence of an emitter change signal, causes the AND gate 320, which is activated by the reset condition of the flip-flop 32 and the set condition of the flip-flop 31, to provide a signal to the OR gate KA which causes the flip-flop 33 to be reset by the next clock pulse. Thus, the machine is forced into state four whose output signal from the decoder 35 provides the run signal to the machine.

If the emitter signal changes during any of the previous states, except for state four, the flip-flops 31–33 are forced into the reset state by the gates KC, KB and KA, respectively. In state four, the A signal at the KC flip-flop is not present so that in state four, the emitter change signals do not affect the state of the flip-flops.

With the start flip-flop 38 set and the zero state output signal from the decoder 35, the AND gate 311 is activated to provide an inhibit operation signal. The output signal from the AND gate 311 also primes two AND gates 318 and 319, the other inputs of which are the set and reset output signals from the ROK flip-flop 310. The AND gates 318 and 319 can drive indicators to indicate the nature of the error. If the ROK flip-flop is set, the AND gate 319 causes the indicator to show that the motor is at fault, and if the flip-flop ROK 310 is reset, the AND gate 318 causes the indicator to indicate that the relay is at fault.

Input signal to the relay flip-flop 315 and the motor flip-flop 316 are also provided by the normal operation part of the controller (not shown) via the dashed input lines.

Hardware controllers such as shown in FIG. 3 have many disadvantages. It is difficult to design a hardwired controller that is efficient, i.e., uses minimum gates and prevents interstate transients. Also, such hardwired controllers are difficult to modify to perform a new function once the design is completed. The efficient design increases in difficulty as the number of required states increases so that, even with computer-aided design, controllers are expensive and time consuming to design. The advent of the microprocessor has provided a viable alternative to the design of large, sequential controlled machines. Replacing the hardware design with a logic flow design provides a level and scope of control not obtainable with hardwired controllers. The sequence of operations in a microprocessor-based controller is determined by control signals in the form of a program rather than decoding logic dependent upon feedback and input variables. Microcomputers are single chip microprocessors having the memory, both random access and read-only, present on the same substrate chip as the control logic itself.

The following description of the implementation of the invention with a microcomputer is described for a NEC microcom-43/44/45, a microcomputer commercially available and manufactured by the Nippon Electric Company. This is a machine with a four-bit accumulator and an input flag register which acts as the input register 102 of FIG. 1 and an output E port which operates as the output register 103 of FIG. 1. The controller 10 of FIG. 1 is embodied in the microcomputer itself. Appendix A describes the instructions used in the present description of the microcomputer controller.

Figure 4:
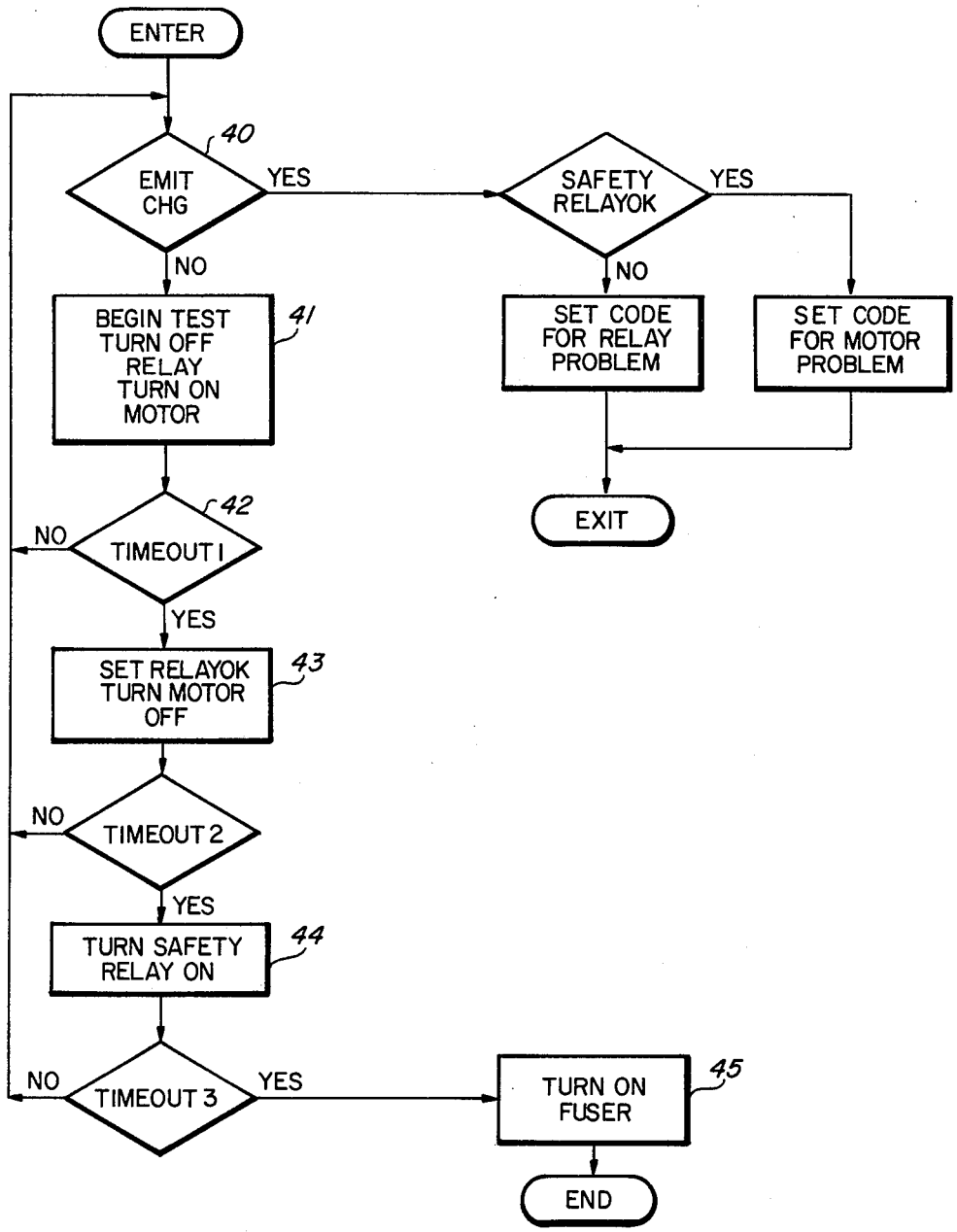
FIG. 4 is a flow diagram of a program suitable for carrying out the invention.

FIG. 4 represents a flowchart for a straightforward execution of a program to practice the invention. The program is entered by turning off the motor bit, the relay bit having been turned on previously. At the step 40, it is determined whether an emitter change has occurred. If not, the step 41 begins the relay test by turning off the relay and turning on the motor. The step 42 represents a delay which is implemented by incrementing or decrementing a count to a test value while cycling through steps 40 and 41 to determine whether an emitter change has taken place. After a sufficient time for an emitter change to take place if one were to take place, the step 43 sets the RELAYOK bit and turns the motor off. After a second delay with no emitter change, the step 44 turns the relay on and provides another delay to determine whether an emitter change has taken place. If not, the step 45 turns on the fuser which is the beginning of the normal operation of the machine.

The programs for controlling machines such as copiers usually are quite complex and each function cannot be programmed in a straightforward manner because of timing considerations and sometimes because different parts of the program are written at different times or by different programmers. Therefore, in the control of the machine like a copier, certain functions to perform a given result are performed at one time and the other necessary functions are performed at another. One method of operating such machines is by the use of two sets of programs. One set of programs is initiated by the zero cross-over of the input power and performs certain routine operations on a periodic basis such as monitoring input control buttons, input signals, condition signals such as temperature and so on. Functions which must be performed synchronously with the drum position are implemented as interrupt programs of the main program. That is, at a certain emitter time, the main program is interrupted to perform the control steps required to be done at the time the drum is in the position indicated by the particular emit count. Upon completion of such operations, the main program resumes. In this way, the monitoring and similar functions can be performed on a periodic basis and the synchronous control function can be performed as required. For more details on such controls by programmed means, see U.S. Pat. No. 4,213,190 entitled "Programmed Copier Control", filed Aug. 28, 1978, Ser. No. 937,396 and assigned to the same assignee as the present application.

Figure 5:
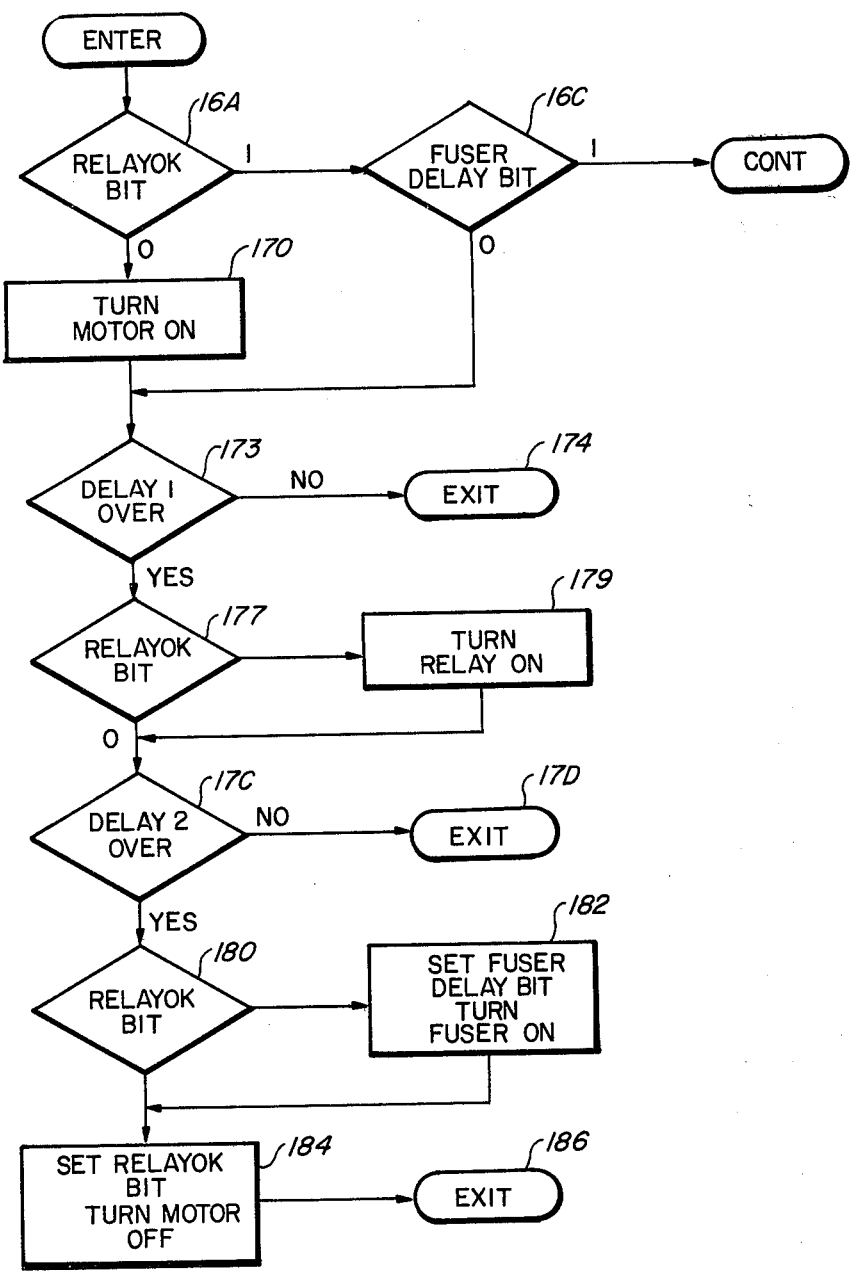
FIG. 5 and FIG. 6 are flowcharts showing an actual implementation of the program.

FIG. 5 is a flowchart of a portion of the program which tests the relay and corresponds to the program listed in Table I below. In Table I the address is represented in hexadecimal characters as is the operation code which may be one or two bytes. The third column of Table I are labels used by the program. The source code is the assembly mnemonics used to create the object program shown in the second column; these mnemonics are explained in Appendix A. The Comments column indicates the function of various instructions. The flowchart of FIG. 5 uses as the reference numerals of the steps, the address at which a particular step begins.

Figure 6:
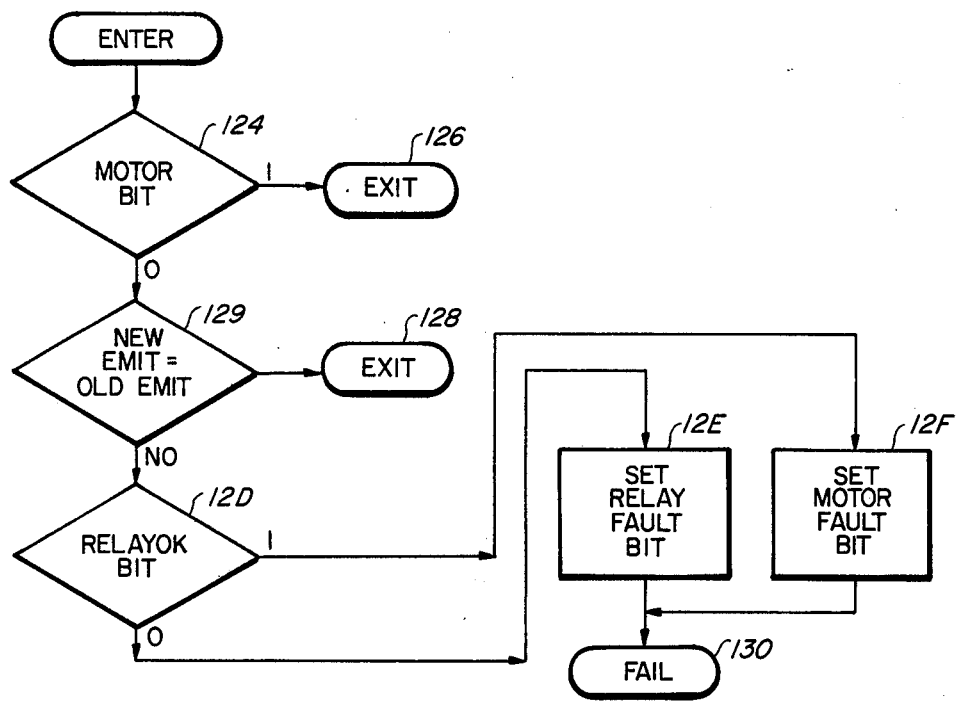

FIG. 6 is a flowchart showing the remainder of the test and is related to Table II in the same way as explained above for the relation of the flowchart of FIG. 6 to Table I.

TABLE I

| ADR | OP CODE | LABEL | SOURCE CODE | COMMENTS |
|---|---|---|---|---|
| 169 | 86 | RELAYS | LDZ 6 | Beginning of relay test segment |
| 16A | 58 | | TMB 0 | Test RELAYOK bit |
| 16B | F0 | | JCP TEST | |
| 16C | 59 | | TMB 1 | Test FUSER DELAY bit |
| 16D | F1 | | JCP WAIT | |
| 16E | A191 | | JMP TIME | Test completed, exit this routine |
| 170 | 74 | TEST | SEB 0 | Turn motor on |
| 171 | 1520 | WAIT | LDI 2 0 | Point to DELAY1 |
| 173 | 1D | | INM | |
| 174 | A186 | | JMP EXIT | Exit if delay not over |
| 176 | 86 | | LDZ 6 | |
| 177 | 53 | | TMB 0 | Test RELAYOK bit |
| 178 | FA | | JCP DELAY | |
| 179 | 77 | | SEB 3 | Turn relay on |
| 17A | 1521 | DELAY | LDI 2 1 | Point to DELAY2 |
| 17C | 1D | | INM | |
| 17D | A186 | | JMP EXIT | Exit if delay not over |
| 17F | 86 | | LDZ 6 | |
| 180 | 58 | | TMB 0 | Test RELAYOK bit |
| 181 | C4 | | JCP OK | |
| 182 | 79 | | SMB 1 | Set FUSER DELAY bit |
| 183 | 75 | | SEB 1 | Turn fuser on |
| 184 | 78 | OK | SMB 0 | Set RELAYOK bit |
| 185 | 64 | | REB 0 | Turn motor off |
| 186 | A080 | EXIT | JMP ZX | Continue normal operation; program returns to this routine at the next zero-crossing. |

TABLE II

| ADR | OP CODE | LABEL | SOURCE CODE | COMMENTS |
|---|---|---|---|---|
| 123 | 83 | | LDZ 3 | Beginning of motor test segment |
| 124 | 58 | | TMB 0 | Test MOTOR bit |
| 125 | E7 | | JCP OFF | |
| 126 | F3 | | JCP N3X | Exit if MOTOR bit set |

TABLE II-continued

| ADR | OP CODE | LABEL | SOURCE CODE | COMMENTS |
|---|---|---|---|---|
| 127 | 1579 | OFF | LDI 7 9 | Point to flag register |
| 129 | 37 | | CMB 3 | Compare NEWEMIT and OLDEMIT |
| 12A | EC | | JCP DIF | |
| 12B | F3 | | JCP N3X | Exit if equal, i.e., no change |
| 12C | 86 | DIF | LDZ 6 | |
| 12D | 58 | | TMB 0 | Test RELAYOK bit |
| 12E | 95 | | LI 5 | Indicate relay fault |
| 12F | 92 | | LI 2 | Indicate motor fault |
| 130 | A6C0 | | JMP FAIL | Go to the fail routine |

APPENDIX A

| | |
|---|---|
| CMB n | Compare the n-th bit of the ACC (accumulator) with the n-th bit of the memory location addressed by the Data Pointer and skip the next instruction if equal. |
| INM | Increment the memory contents addressed by the Data Pointer and skip the next instruction if the result is zero. |
| JCP label | Jump within the current page to address corresponding to the label. |
| JMP label | Jump to address using the immediate byte which corresponds to the label. |
| LDI mn | Load the data pointer with immediate data, i.e., (mn) 16. |
| LDZ n | Load the data pointer with (0n)16'. |
| LI n | Load immediate data in ACC, i.e., (n)16'. |
| REB n | Reset the n-th bit of Port E. |
| SEB n | Set the n-th bit of Port E. |
| SMB n | Set the n-th bit in the memory location addressed by the data pointer. |
| TMB n | Test the n-th bit in the memory location addressed by the data pointer and skip the next instruction if it is set (1). |

Both the hardwired controller and a programmable controller have been used to illustrate the embodiment of the invention.

Various modifications to the systems and circuits described and illustrated to explain the concepts and modes of practicing the invention can be made by those of ordinary skill in the art within the principles or scope of the invention as expressed in the following claims.

What is claimed is:

1. A method for verifying, in a system having at least first and second operations initiated and terminated by a controller, the functioning of said second operation being dependent on the successful functioning of said first operation and said second operation being capable of furnishing a sensible result when functioning, that said first operation is responsive to said controller comprising the steps of:
   terminating said first operation;
   initiating said second operation;
   sensing the result of said second operation; and
   determining that said first operation is not responsive to said controller if the sensed result is manifested.

2. The invention claimed in claim 1 including the initial steps of:
   energizing said first operation;
   energizing and terminating said second operation;
   sensing the result of said second operation; and
   determining a malfunction in said second operation if the sensed result is manifested.

3. The combination comprising:
   operating apparatus having components requiring power;
   power source means;
   controller means for providing control signals;
   switch means for selectively coupling said power source means to said components requiring power;
   means in said controller means for supplying a switch control signal to activate said switch means;
   means in said apparatus for supplying response signals indicative of the state of said switch means;
   means in said controller means for sensing said response signals; and
   means in said controller means for supplying an inhibit signal to said apparatus to prevent its operation if the sensed response signal is incorrect according to the state of the switch control signal.

4. The invention claimed in claim 3 wherein said operating apparatus includes as a component motor means, power connect control means coupled between said switch means and said motor means for selectively supplying power to said motor means; and wherein said response signal supplying means includes means coupled to the shaft of said motor means for supplying the response signal while said motor means is activated; and including means in said controller means for activating said power connect control means.

5. In a power operated apparatus having a power safety relay means for selectively supplying power to said apparatus, motor means included in said apparatus for supplying torque to operate parts of said apparatus, signal producing means coupled to said motor means for supplying signals indicative of the rotation of said motor means, switch means coupled between said relay means and said motor means for selectively controlling said motor means, controller means for supplying control signals to operate said relay means and said switch means, means in said controller means for determining the responsiveness of said safety relay means to said control means comprising:
   means for closing said switch means to connect said motor means to said power safety relay means;
   means for removing said control signal from said relay means; and
   means responsive to the occurrence thereafter of said rotation indicative signals for inhibiting the operation of said apparatus.

* * * * *